United States Patent
Noh

(10) Patent No.: US 6,538,941 B2
(45) Date of Patent: Mar. 25, 2003

(54) SEMICONDUCTOR MEMORY DEVICE AND METHOD OF PRE-CHARGING I/O LINES

(75) Inventor: Mi-Jung Noh, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/812,072

(22) Filed: Mar. 19, 2001

(65) Prior Publication Data

US 2002/0131316 A1 Sep. 19, 2002

(51) Int. Cl.[7] ................................................. G11C 7/00
(52) U.S. Cl. .................. 365/203; 365/230.03; 365/202; 365/204
(58) Field of Search ........................... 365/189.01, 203, 365/204, 202, 230.03, 230.01

(56) References Cited

U.S. PATENT DOCUMENTS

| 5,650,975 A | * | 7/1997 | Hamade et al. ....... 365/230.011 |
| 6,275,430 B1 | * | 8/2001 | Ka .............................. 365/203 |
| 2001/0026496 A1 | * | 10/2001 | Hidaka .................. 365/230.03 |
| 2002/0015350 A1 | * | 2/2002 | Tomishima et al. .... 365/230.03 |
| 2002/0027818 A1 | * | 3/2002 | Kato et al. .................. 365/208 |

* cited by examiner

*Primary Examiner*—Viet Q. Nguyen
(74) *Attorney, Agent, or Firm*—F. Chau & Associates, LLP

(57) ABSTRACT

There is provided a semiconductor memory device and a method of pre-charging I/O lines therein. Multiplexers are controlled in such a way as to disconnect their normally connected switches only when desired, thereby reducing the number of pre-charging means employed as compared to prior art devices and methods.

16 Claims, 4 Drawing Sheets

SEMICONDUCTOR MEMORY DEVICE AND METHOD OF PRE-CHARGING I/O LINES

BACKGROUND OF THE INVENTION

1. Technical Field

The present invention relates to a semiconductor memory device and a method of pre-charging I/O lines therein.

2. Description of Related Art

Current high-quality graphic systems require a memory that has sufficient capacity to implement high-resolution graphics and to perform 3D functions. These systems also require a larger bandwidth between the memory and a logic that performs a graphic engine function. To satisfy these requirements, Rambus DRAMs and Merged Memory and Logic (MML) have been introduced.

However, to realize a higher bandwidth in a DRAM core, such memory devices simultaneously operate a plurality of data buses differently than that of existing devices. Memory devices that have a large number of internal data buses and relatively few column addresses generally employ a structure in which column selecting lines are arranged in a region of a sense amplifier, and I/O lines are arranged over a cell array (see U.S. Pat. No. 5,892,719, entitled "Redundancy Circuit Technique Applied Dram of Multi-bit I/O having Overlaid-DQ Bus", issued on Apr. 6, 1999).

In memory devices having such a structure, a pre-charging operation is performed in a pre-charged state wherein all multiplexers are turned off to isolate local I/O lines and global I/O lines. When a column address strobe active command is input in the pre-charged state, corresponding local I/O lines and corresponding global I/O lines are connected to each other using a decoding address.

In such a method of controlling I/O lines, multiplexers are turned off so that local I/O lines and global I/O lines are respectively isolated during a pre-charging operation. Accordingly, to prevent a floating state of the respective I/O lines, each pair of I/O lines should have a pre-charging means associated therewith. However, in the case of a compound semiconductor memory device, the depth of the columns (i.e., a combination number by a column address) becomes lower, and the number of I/O lines becomes relatively larger. Accordingly, the number of pre-charging means set up in each line becomes larger.

Since such a pre-charging means is disposed on a memory core, the layout of the memory core becomes undesirably complex. In addition, as the number of the I/O lines increases, the size of the chip increases, as well as the low power consumption.

SUMMARY OF THE INVENTION

The problems stated above, as well as other related problems of the prior art, are solved by the present invention, a semiconductor memory device and a method for pre-charging I/O lines. The present invention allows for a simple layout of the memory core, a small chip size, and power consumption.

According to an aspect of the invention, there is provided a semiconductor memory device having first and second memory regions. The device includes a plurality of I/O sense amplifiers. A plurality of first and second local I/O line pairs are respectively arranged in parallel columns on the first and second memory regions. A plurality of first and second pre-charging means respectively pre-charge the plurality of first and second local I/O line pairs. A plurality of first and second switching means are arranged between the first and second memory regions and respectively connected to terminals of the plurality of first and second local I/O line pairs. A plurality of global I/O line pairs are arranged between the first and second memory regions and respectively connected to output terminals of the plurality of first and second switching means and the plurality of I/O sense amplifiers. Switching control means turns on all of the plurality of first and second switching means in a standby mode, turns off the plurality of second switching means in response to a read command or a write command corresponding to the first memory region, and simultaneously pre-charges the plurality of first and second local I/O line pairs and the plurality of global line pairs through the plurality of first and second pre-charging means by turning on any of the plurality of second switching means that have been turned off in response to a command subsequent to the read or the write command.

According to another aspect of the invention, the switching control means includes first combination means for controlling the plurality of first switching means in response to a row address strobe pre-charge command corresponding to the first memory region, a row address strobe pre-charge command corresponding to the second memory region, and a column address strobe active command corresponding to the second memory region. Second combination means control the plurality of second switching means in response to the row address strobe pre-charge command corresponding to the second memory region, the row address strobe pre-charge command corresponding to the first memory region, and a column address strobe active command corresponding to the first memory region.

According to yet another aspect of the invention the first combination means includes an inverter for inverting the row address strobe pre-charge command corresponding to the second memory region. A first NOR gate NOR-combines the row address strobe pre-charge command corresponding to the first memory region and an output of the inverter. A second NOR gate NOR-combines an output of the first NOR gate and the column address strobe active command corresponding to the second memory region. Buffer means buffer and provide an output of the second NOR gate to respective control terminals of the plurality of first switching means.

According to yet further another aspect of the present invention, the second combination means includes an inverter for inverting the row address strobe pre-charge command corresponding to the first memory region. A first NOR gate NOR-combines the row address strobe pre-charge command corresponding to the second memory region and an output of the inverter. A second NOR gate NOR-combines an output of the first NOR gate and the column address strobe active command corresponding to the first memory region. Buffer means buffer and provide an output of the second NOR gate to respective control terminals of the plurality of second switching means.

According to yet still further another aspect of the invention, the plurality of first and second local I/O line pairs are arranged in a same direction as a bit line and in a perpendicular direction with respect to a column selecting line and a word line.

According to an additional aspect of the invention, there is provided a method of pre-charging I/O lines of a semiconductor memory device that includes first and second memory regions. The method includes the step of respectively connecting first and second local I/O line pairs arranged on the first and second memory regions to global I/O line pairs in a standby mode, and simultaneously pre-charging the first and second local I/O line pairs and the global I/O line pairs by first and second pre-charging means respectively connected to the first and second I/O line pairs. The first local I/O line pairs are respectively disconnected from the global local I/O line pairs in response to a read command or a write command corresponding to the first memory region. The second local I/O line pairs are respectively re-connected with the global local I/O line pairs in response to a command subsequent to the read command or the write command, and the first and second local I/O line pairs and the global local I/O line pairs are simultaneously pre-charged by the first and second pre-charging means respectively connected to the first and second local I/O line pairs.

According to a yet additional aspect of the invention, there is provided a semiconductor memory device having upper memory banks and lower memory banks arranged in rows. The device includes a plurality of upper local I/O line pairs arranged in columns. A plurality of upper pre-charging means respectively pre-charge the plurality of upper local I/O line pairs. A plurality of lower local I/O line pairs are arranged in the columns. A plurality of lower pre-charging means respectively pre-charged the plurality of lower local I/O line pairs. A plurality of upper switching means are arranged between the upper and lower memory banks and respectively connected to terminals of the plurality of upper local I/O line pairs. A plurality of lower switching means are arranged between the upper and lower memory banks and respectively connected to terminals of the plurality of lower local I/O line pairs. A plurality of global I/O line pairs arranged between the upper and lower memory banks and respectively connected to outputs of the plurality of upper switching means and to outputs of the plurality of lower switching means. A plurality of I/O sense amplifiers are respectively connected to the plurality of global I/O line pairs. Switching control means turn off all of the plurality of upper switching means and the plurality of lower switching means in a standby mode, turn off the plurality of upper switching means or the plurality of lower switching means in response to a read command or a write command corresponding to the upper or the lower memory bank, and simultaneously pre-charge the plurality of upper I/O line pairs, the plurality of lower local I/O line pairs and the plurality of global I/O line pairs through the plurality of upper pre-charging means and the plurality of lower pre-charging means by turning on any of the switching means that have been turned off in response to a command subsequent to the read command or the write command.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

Figure 1:
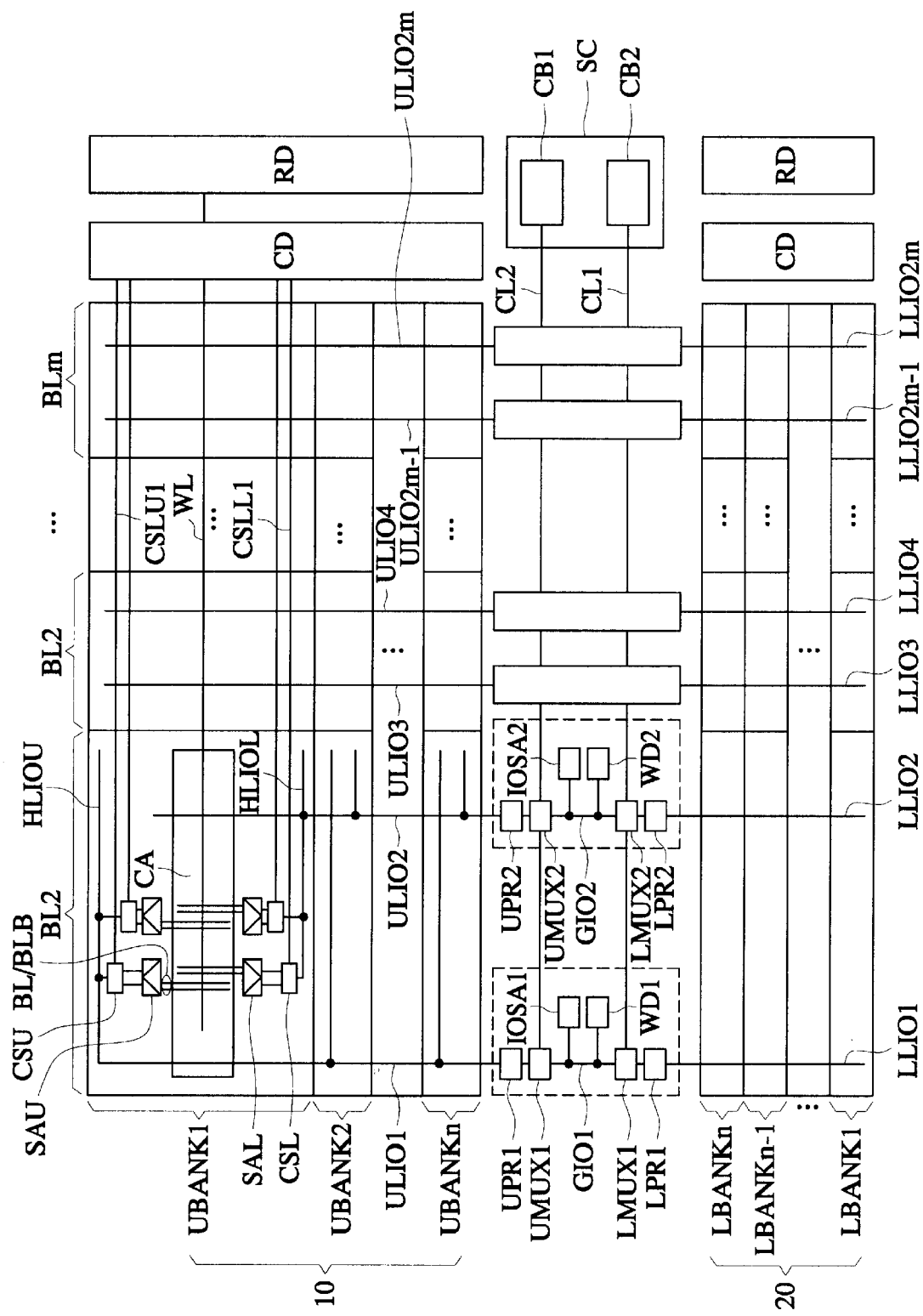
FIG. 1 is a block diagram illustrating an embodiment of a memory core of a semiconductor memory device according to a preferred embodiment of the present invention.

FIG. 1 is a block diagram illustrating a memory core of a semiconductor memory device according to the preferred embodiment of the present invention. The memory core includes a first memory area 10 and a second memory area 20. The first memory area 10 includes upper memory banks UBANK1 to UBANKn arranged in rows, and the second memory area 20 includes lower memory banks LBANK1 to LBANKn also arranged in rows. Each of the upper and lower memory banks includes memory blocks BL1 to BLm arranged in columns. Each of the memory blocks includes a cell array CA that, in turn, includes a plurality of memory cells arranged in a matrix form, and upper sense amplifiers SAU and lower sense amplifiers SAL respectively arranged upstream and downstream of the cell array CA. Bit line pairs BL/BLB extend from the cell array CA in a column direction, with the two adjacent bit line pairs BL/BLB being spaced apart from and parallel to each other. The upper sense amplifiers SAU are respectively coupled to corresponding bit line pairs BL/BLB and share a horizontal local I/O line pair HLIOU via corresponding column selectors CSU that are switched by a column selecting line CSLU1. The lower sense amplifiers SAL are respectively coupled to corresponding bit line pairs BL/BLB and share a horizontal local I/O line pair HLIOL via corresponding column selectors CLS that are switched by a column selecting line CSLL1. Accordingly, for each of the upper and lower bit line pairs, two pairs are selected in each memory block. That is, column selectors having the same number in each memory block are simultaneously controlled by the same column selecting line. A word line WL is disposed in the same direction as the column selecting line.

In this embodiment, a row decoder RD and a column decoder CD are respectively disposed at the right side of the first and second memory areas 10 and 20. However, it is to be appreciated that the locations of the row decoder RD and the column decoder CD are not limited to the preceding arrangement and, thus, other arrangements may be implemented which maintain the spirit and scope of the present invention. For example, the row decoder RD and the column decoder CD may be disposed between memory blocks. In each of the same memory block columns of the upper memory banks UBANK1 to UBANKn, two upper local I/O line pairs ULIO1 and ULIO2 to ULIO2m-1 and ULIO2m are disposed in a column direction. Accordingly, the horizontal local I/O line pairs HLIOU of respective memory banks UBANK1 to UBANKn share the upper local I/O line pair ULIO1, and the horizontal local I/O line pairs HLIOL share the upper local I/O line pair ULIO2. The upper local I/O line pair ULIO1 is connected to a first or upper switching means, i.e., an upper multiplexer UMUX1, via a pre-charging means UPR1. The upper local I/O line pair ULIO2 is connected to an upper multiplexer UMUX2 via a pre-charging means UPR2. The second memory area 20 has a structure that is symmetrical with respect to the memory area 10. The lower local I/O line pair LLIO1 is connected to a second or lower switching means, i.e., a lower multiplexer LMUX1, via a pre-charging means LPR1. The lower local I/O line pair LLIO2 is connected to a lower multiplexer LMUX2 via a pre-charging means LPR2. The upper multiplexers UMUX1 to UMUX2m share a first control signal line CL2, and the lower multiplexers UMUX1 to UMUX2m share a second control signal line CL1. The upper and lower multiplexers UMUX1 to UMUX2m and UMUX1 to UMUX2m are respectively coupled to a first combination means CB1 and to a second combination means CB2 of a switching control means SC. The upper and lower multiplexers UMUX1 and LMUX1 are connected to a global I/O line pair GIO1 arranged therebetween. The upper and lower multiplexers UMUX2 and LMUX2 are connected to a global I/O line pair GIO2 arranged therebetween. The global I/O line pair GIO1 is connected to an I/O sense amplifier IOSA1 and a write driver WD1, and the global I/O line pair GIO2 is connected to an I/O sense amplifier IOSA2 and a write driver WD2.

Figure 2:
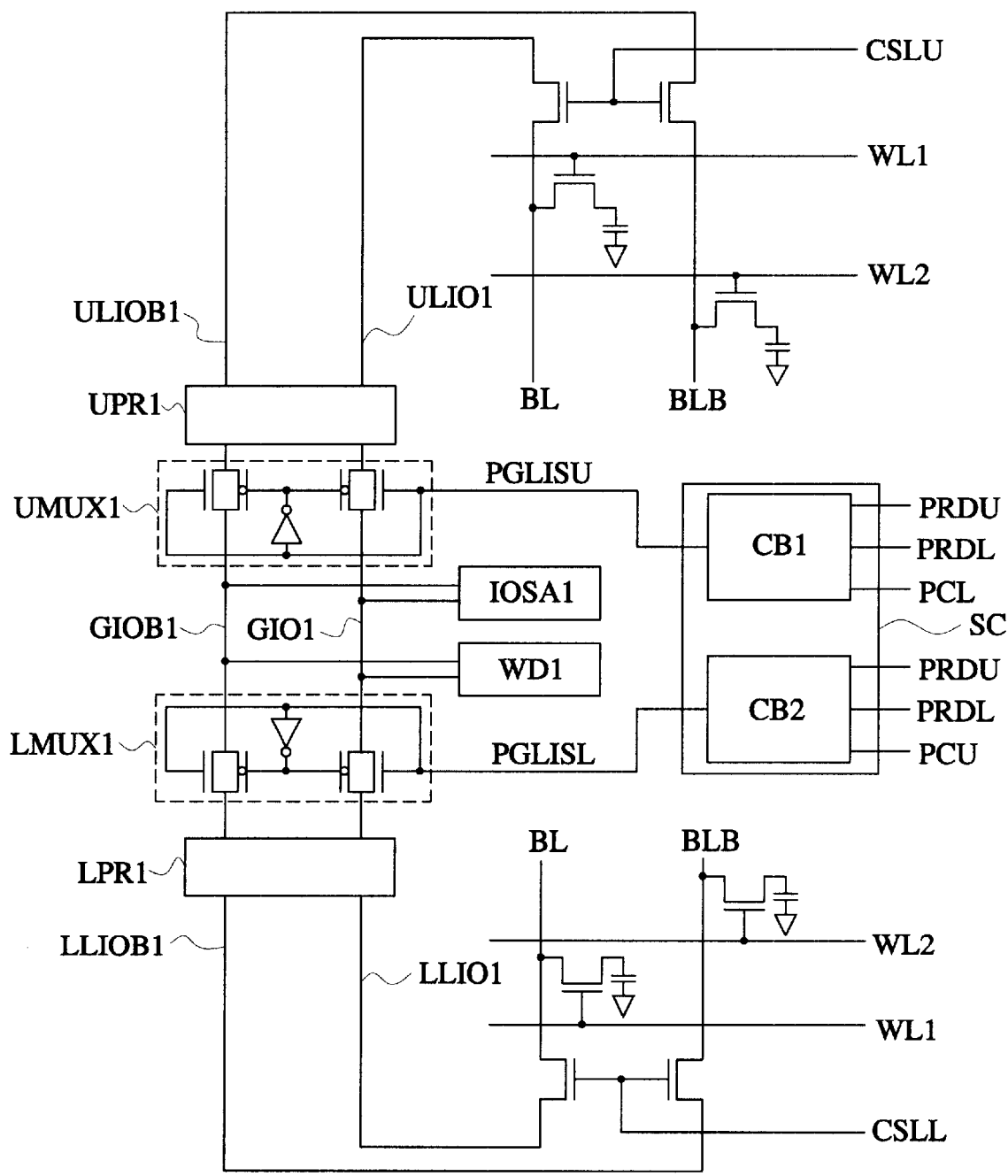
FIG. 2 is a block diagram illustrating an input/output path from a memory cell to a sense amplifier shown in FIG. 1.

FIG. 2 is a block diagram illustrating an I/O path from the memory cell to the I/O sense amplifier of FIG. 1. The upper and lower multiplexers UMUX1 and LMUX1 share the global I/O line pair GIO1 that is connected to both the I/O sense amplifier IOSA1 and the write driver WD1. The upper multiplexer UMUX1 is switched in response to a control signal PGLISU from the first combination means CB1 of the switching control means SC, and the lower multiplexer LMUX1 is switched in response to a control signal PGLISL from the second combination means CB2 of the switching control means SC.

Figure 3:
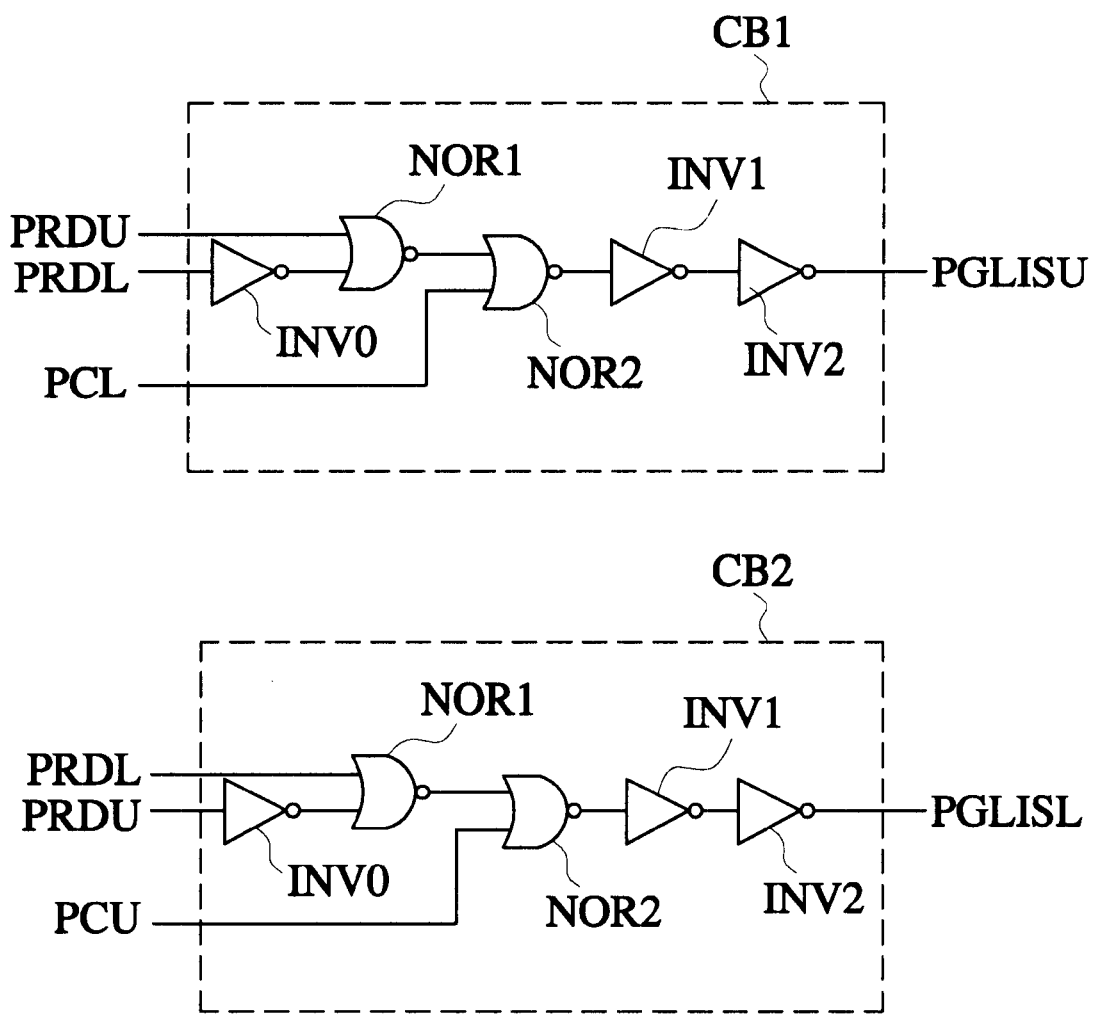
FIG. 3 is a circuit diagram illustrating a combination means of a switching control means shown in FIG. 2.

FIG. 3 is a circuit diagram illustrating the combination means of the switching control means of FIG. 2. Each combination means includes NOR gates NOR1 and NOR2, an inverter INV0, and buffers INV1 and INV2. A PRDL signal is inverted by the inverter INV0 and then inputted to the NOR gate NOR1 of the first combination means CB1. The PRDL signal is synchronous with a row address strobe pre-charge command RAS-PRL of the second memory area 20

The inverted PRDL signal and a PRDU signal are NOR-combined through the NOR gate NOR1. The PRDU signal is synchronous with a row address strobe pre-charge command RAS-PRU of the first memory area 10. A NOR-combined output of the NOR gate NOR1 and a PCL signal are NOR-combined through the NOR gate NOR2. The PCL signal is a column address strobe active signal of the second memory area 20 The column address strobe active signal is synchronous with a read or a write command of the second memory area 20. An output from the NOR gate NOR2 is buffered by buffers INV1 and INV2 buffer and output as a PGLISU signal to respective control terminals of the upper multiplexers UMUX1 to UMUX2m.

A PRDU signal is inverted through the inverter INV0 of the second combination means CB2. The PRDU signal is synchronous with a row address strobe pre-charge command RAS-PRU of the first memory area 10. The inverted PRDU signal and a PRDL signal are NOR-combined through the NOR gate NOR1. The PRDL signal is synchronous with a row address strobe pre-charge command RAS-PRL of the second memory area 20. A NOR-combined output of the NOR gate NOR1 and a PCU signal are NOR-combined through the NOR gate NOR2. The PCU signal is a column address strobe active signal of the first memory area 1. The column address strobe active signal is synchronous with a read or write command of the first memory area 10. An output from the NOR gate NOR2 is buffered by buffers INV1 and INV2 and output as a PGLISL signal to respective control terminals of the lower multiplexers LMUX1 to LMUX2m.

Figure 4:
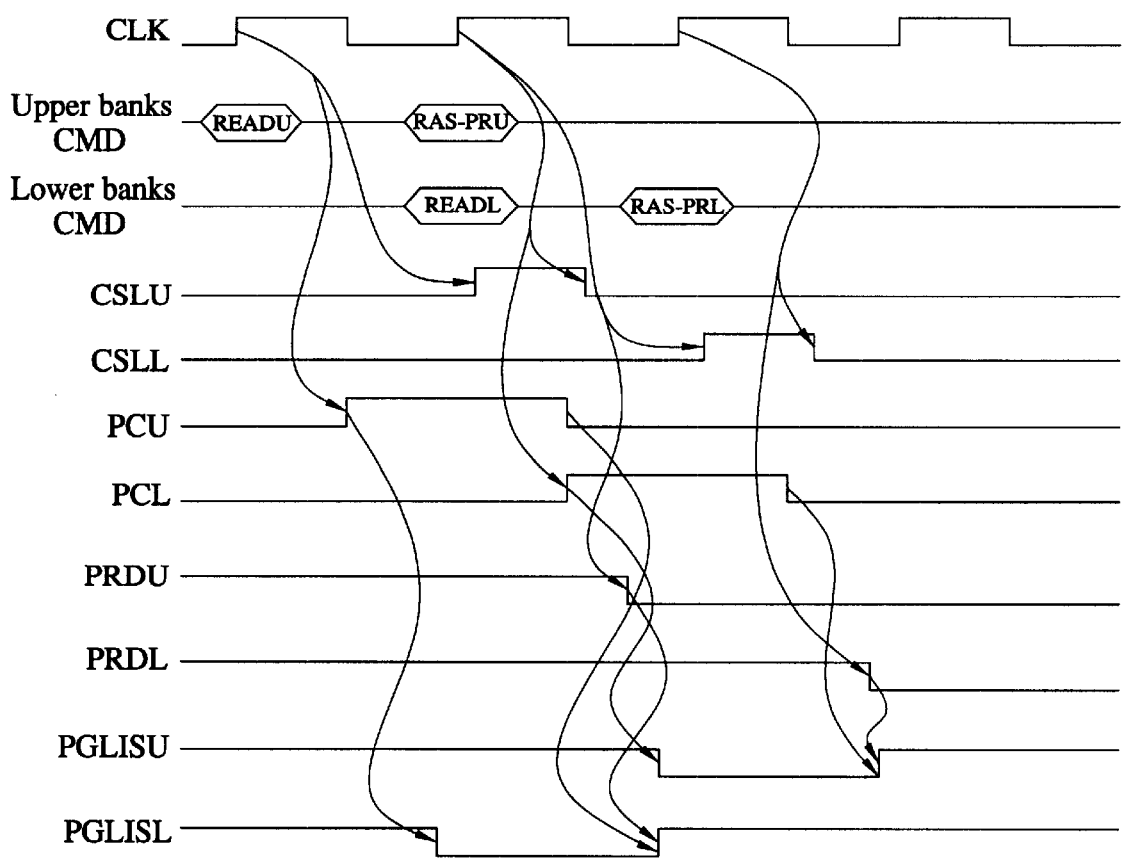
FIG. 4 is a timing diagram explaining a pre-charging operation of I/O line according to the present invention.

FIG. 4 is a timing diagram illustrating an I/O line pre-charging operation according to the preferred embodiment of the present invention. First, in a standby mode, the multiplexers UMUX1 and LMUX2 are all turned on to connect the upper and lower local I/O line pairs ULIO1/ULIOB1 and LLIO1/LLIOB1 and the global I/O line pair GIO1/GIOB1. Therefore, all of the I/O lines are kept in a pre-charged state by the same voltage. Then, when a read command READU of the first memory area 10 is input by being synchronized with a rising edge of a first clock, a PCU signal that is a column address strobe active signal transitions to a logic "high" level from a logic "low" level. The switching control means SC generates a second control signal PGLISL through the second combination means CB2 in response to a rising edge of the PCU signal. That is, the PGLISL signal transitions from a logic "high" level to a logic "low" level. The PGLISL signal having a logic "low" level turns the lower multiplexer LMUX1 off, thereby disconnecting the global I/O line pair GIO1/GIOB1 from the lower local I/O line pair LLIO1/LLIOB1. Accordingly, all of the lower multiplexers are turned off, and thus the global I/O line pairs and the lower local I/O line pairs are respectively disconnected.

Therefore, the upper local I/O line pair ULIO1/ULIOB1 occupies the global I/O line pair GIO1/GIOB1, so that data read out from a selected memory cell are transmitted to the I/O sense amplifier IOSA1 in response to a column line selecting signal CSLU. Accordingly, a pair of cell data is output from each memory block of a selected memory bank in the upper memory area 10, so that 2m-number of data are simultaneously output.

After a read operation of the upper memory area is completed, the PCU signal transitions from a logic "high" level to a logic "low" level, and the PRDU signal transitions from a logic "high" level to a logic "low" level to be disabled, when the row address strobe pre-charge command RAS-PRU and a read command READL of the second memory area 20 are input by being synchronized with a rising edge of a next second clock. In response to a trailing edge of the PCU signal, the second combination means CB2 of the switching control means SC enables the second control signal PGLISL to transition from a logic "low" level to a logic "high" level. The lower multiplexer LMUX1 is turned on by the PGLISL signal having a logic "high" level, and thus the global I/O line pair GIO1/GIOB1 and the lower local I/O line pair LLIO1/LLIOB1 are connected to each other. Accordingly, since all of the lower multiplexers are simultaneously turned on, the global I/O line pairs and the lower local I/O line pairs are respectively connected to each other. At the same time, the PCL signal, i.e., a column address strobe active signal, transitions from a logic "low" level to a logic "high" level. In response to a rising edge of the PCL signal, the switching control means SC generates a first control signal PGLISU through the first combination means CB1. That is, the PGLISU signal transitions from a logic "high " level to a logic "low" level. The upper multiplexer UMUX1 is turned off by the PGLISU signal having a logic "low" level, so that the global I/O line pair GIO1/GIOB1 and the upper local I/O line pair ULIO1/ULIOB1 are disconnected from each other. Accordingly, since all of the upper multiplexers are turned off, the global I/O line pairs and the upper local I/O line pairs are respectively disconnected.

Therefore, the lower local I/O line pair LLIO1/LLIOB1 occupies the global I/O line pair GIO1/GIOB1 to transmit data read out from a selected memory cell to the I/O sense amplifier IOSA1 in response to a column line selecting signal CSLL. Accordingly, since a pair of cell data is output from each memory block of a selected memory bank in the lower memory area 20, a total of 2m-number of data are simultaneously output.

After a read operation of a lower memory bank is completed in this manner, a row address strobe pre-charge command RAS-PRL is input by being synchronized with to a rising edge of a next third clock. In response to the command RAS-PRL, the PCL signal transitions from a logic "high" level to a logic "low" level, and the PRDL signal transitions from a logic "high" level to a logic "low" level.

In response to a trailing edge of the PRDL signal, the switching control means SC makes the first control signal PGLISU transition from a logic "low" level to a logic "high" level through the first combination means CB1. The upper multiplexer UMUX1 is turned on by the PGLISU signal having a logic "high" level, so that the global I/O line pair GIO1/GIOB1 and the upper local I/O line pair ULIO1/ULIOB1 are connected to each other. Accordingly, since the upper and lower multiplexers are all turned on, the upper and lower local I/O line pairs are respectively connected to the global I/O line pairs, and respective global I/O line pairs are pre-charged by upper and lower pre-charge means.

Thus, since the normally connected switches of the multiplexers are controlled to be disconnected only when desired, the number of the pre-charging means can be reduced with respect to the prior art approach of connecting normally disconnected switches, thereby providing a semiconductor memory device having a simplified circuit and low power consumption.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor memory device having first and second memory regions, comprising:
    a plurality of I/O sense amplifiers;
    a plurality of first and second local I/O line pairs respectively arranged in parallel columns on the first and second memory regions;
    a plurality of first and second pre-charging means for respectively pre-charging the plurality of first and second local I/O line pairs;
    a plurality of first and second switching means arranged between the first and second memory regions and respectively connected to terminals of the plurality of first and second local I/O line pairs;
    a plurality of global I/O line pairs arranged between the first and second memory regions and respectively connected to output terminals of the plurality of first and second switching means and the plurality of I/O sense amplifiers; and
    switching control means for turning on all of the plurality of first and second switching means in a standby mode, turning off the plurality of second switching means in response to a read command or a write command corresponding to the first memory region, and simultaneously pre-charging the plurality of first and second local I/O line pairs and the plurality of global line pairs through the plurality of first and second pre-charging means by turning on any of the plurality of second switching means that have been turned off in response to a command subsequent to the read or the write command.

2. The semiconductor memory device of claim 1, wherein the switching control means comprises:
    first combination means for controlling the plurality of first switching means in response to a row address strobe pre-charge command corresponding to the first memory region, a row address strobe pre-charge command corresponding to the second memory region, and a column address strobe active command corresponding to the second memory region; and
    second combination means for controlling the plurality of second switching means in response to the row address strobe pre-charge command corresponding to the second memory region, the row address strobe pre-charge command corresponding to the first memory region, and a column address strobe active command corresponding to the first memory region.

3. The semiconductor memory device of claim 2, wherein the first combination means comprises:
    an inverter for inverting the row address strobe pre-charge command corresponding to the second memory region;
    a first NOR gate for NOR-combining the row address strobe pre-charge command corresponding to the first memory region and an output of the inverter;
    a second NOR gate for NOR-combining an output of the first NOR gate and the column address strobe active command corresponding to the second memory region; and
    buffer means for buffering and providing an output of the second NOR gate to respective control terminals of the plurality of first switching means.

4. The semiconductor memory device of claim 2, wherein the second combination means comprises:
    an inverter for inverting the row address strobe pre-charge command corresponding to the first memory region;
    a first NOR gate for NOR-combining the row address strobe pre-charge command corresponding to the second memory region and an output of the inverter;
    a second NOR gate for NOR-combining an output of the first NOR gate and the column address strobe active command corresponding to the first memory region; and
    buffer means for buffering and providing an output of the second NOR gate to respective control terminals of the plurality of second switching means.

5. The semiconductor memory device of claim 1, wherein the plurality of first and second local I/O line pairs are arranged in a same direction as a bit line and in a perpendicular direction with respect to a column selecting line and a word line.

6. The semiconductor memory device of claim 1, wherein the plurality of first and second local I/O line pairs are arranged apart from each other.

7. The semiconductor memory device of claim 1, wherein each of the plurality of first and second switching means are connected to the respective terminals of one of the plurality of first and second I/O line pairs.

8. The semiconductor memory device of claim 1, wherein each of the plurality of global I/O line pairs are connected to the respective output terminals of one of the plurality of first and second switching means and to one of the plurality of sense amplifiers.

9. A method of pre-charging I/O lines of a semiconductor memory device that includes first and second memory regions, the method comprising the steps of:
    respectively connecting first and second local I/O line pairs arranged on the first and second memory regions to global I/O line pairs in a standby mode, and simultaneously pre-charging the first and second local I/O line pairs and the global I/O line pairs by first and second pre-charging means respectively connected to the first and second local I/O line pairs;
    respectively disconnecting the first local I/O line pairs from the global local I/O line pairs in response to a read command or a write command corresponding to the first memory region; and respectively re-connecting the second local I/O line pairs with the global I/O line pairs in response to a command subsequent to the read command or the write command, and simultaneously pre-charging the first and second local I/O line pairs and the global local I/O line pairs by the first and second pre-charging means respectively connected to the first and second local I/O line pairs.

10. The method of claim 9, wherein the first and second local I/O line pairs are arranged in a same direction as a bit line and in a perpendicular direction with respect to a column selecting line and a word line.

11. A semiconductor memory device having upper memory banks and lower memory banks arranged in rows, the device comprising:

a plurality of upper local I/O line pairs arranged in columns;

a plurality of upper pre-charging means for respectively pre-charging the plurality of upper local I/O line pairs;

a plurality of lower local I/O line pairs arranged in the columns;

a plurality of lower pre-charging means for respectively pre-charging the plurality of lower local I/O line pairs;

a plurality of upper switching means arranged between the upper and lower memory banks and respectively connected to terminals of the plurality of upper local I/O line pairs;

a plurality of lower switching means arranged between the upper and lower memory banks and respectively connected to terminals of the plurality of lower local I/O line pairs;

a plurality of global I/O line pairs arranged between the upper and lower memory banks and respectively connected to outputs of the plurality of upper switching means and to outputs of the plurality of lower switching means;

a plurality of I/O sense amplifiers respectively connected to the plurality of global I/O line pairs;

switching control means for turning off all of the plurality of upper switching means and the plurality of lower switching means in a standby mode, turning off the plurality of upper switching means or the plurality of lower switching means in response to a read command or a write command corresponding to the upper or the lower memory bank, and simultaneously pre-charging the plurality of upper local I/O line pairs, the plurality of lower local I/O line pairs and the plurality of global I/O line pairs through the plurality of upper pre-charging means and the plurality of lower pre-charging means by turning on any of the switching means that have been turned off in response to a command subsequent to the read command or the write command.

12. The semiconductor memory device of claim 11, wherein the switching control means comprises:

first combination means for controlling the first switching means in response to a row address strobe pre-charge command corresponding to the first memory region, a row address strobe pre-charge command corresponding to the second memory region, and a column address strobe active command corresponding to the second memory region; and second combination means for controlling the second switching means in response to a row address strobe pre-charge command corresponding to the second memory region, a row address strobe pre-charge command corresponding to the first memory region, and a column address strobe active command corresponding to the first memory region.

13. The semiconductor memory device of claim 12, wherein the first combination means comprises:

an inverter for inverting the row address strobe pre-charge command corresponding to the second memory region;

a first NOR gate for NOR-combining the row address strobe pre-charge command corresponding to the first memory region and an output of the inverter;

a second NOR gate for NOR-combining an output of the first NOR gate and the column address strobe active command corresponding to the second memory region; and buffer means for buffering and providing an output of the second NOR gate to respective control terminals of the plurality of first switching means.

14. The semiconductor memory device of claim 12, wherein the second combination means comprises:

an inverter for inverting the row address strobe pre-charge information of the first memory region;

a first NOR gate for NOR-combining the row address strobe pre-charge information of the second memory region and an output of the inverter;

a second NOR gate for NOR-combining an output of the first NOR gate and the column address strobe active information of the first memory region; and buffer means for buffering and providing an output of the second NOR gate to respective control terminals of the plurality of second switching means.

15. The semiconductor memory device of claim 11, wherein the plurality of first and second local I/O line pairs are arranged in a same direction as a bit line and in a perpendicular direction with respect to a column selecting line and a word line.

16. The semiconductor memory device of claim 11, wherein the plurality of upper local I/O line pairs are arranged apart from each other, and the plurality of lower local I/O line pairs are arranged apart from each other.

* * * * *